(12) United States Patent  
Viertl et al.

(10) Patent No.: US 8,314,611 B2  
(45) Date of Patent: Nov. 20, 2012

(54) MAGNETIC PARTICLE INSPECTION APPARATUS AND METHOD

(75) Inventors: John Ruediger Mader Viertl, Niskayuna, NY (US); Manu Mathai, Karnataka (IN); Grady Baggett, Simpsonville, SC (US)

(73) Assignee: General Electric Company, Schenectady, NY (US)

( * ) Notice: Subject to any disclaimer, the term of this patent is extended or adjusted under 35 U.S.C. 154(b) by 371 days.

(21) Appl. No.: 12/684,514

(22) Filed: Jan. 8, 2010

(65) Prior Publication Data

US 2011/0169485 A1 Jul. 14, 2011

(51) Int. Cl.
*G01N 27/84* (2006.01)
(52) U.S. Cl. .......... 324/216; 324/232; 324/261
(58) Field of Classification Search .......... 324/216, 324/235, 226, 227, 228, 232, 234, 238, 262, 324/263; 361/149, 143; 228/104; 73/104, 73/112
See application file for complete search history.

(56) References Cited

U.S. PATENT DOCUMENTS

| | | | | |
|---|---|---|---|---|
| 3,324,354 | A | * | 6/1967 | Schroeder et al. ............ 361/143 |
| 3,402,349 | A | * | 9/1968 | Parker ........................... 324/215 |
| 3,596,143 | A | | 7/1971 | Gruetzmacher et al. |
| 4,433,289 | A | | 2/1984 | Mlot-Fijalkowski et al. |
| 4,741,203 | A | | 5/1988 | Willaman et al. |
| 4,759,211 | A | | 7/1988 | Longley-Cook |
| 4,931,731 | A | * | 6/1990 | Jenks ............................ 324/216 |

OTHER PUBLICATIONS www.ndt.org; Title: Field Direction and Intensity.*

* cited by examiner

*Primary Examiner* — Melissa Koval
*Assistant Examiner* — Feba Pothen
(74) *Attorney, Agent, or Firm* — McNees Wallace & Nurick LLC

(57) ABSTRACT

A magnetic particle inspection (MPI) apparatus is disclosed that includes a chordal field coil pair and a radial field coil pair. The chordal field coil pair includes first and second chordal field coils configured to produce a chordally oriented magnetic flux about a test article.

19 Claims, 6 Drawing Sheets

MAGNETIC PARTICLE INSPECTION APPARATUS AND METHOD

FIELD OF THE INVENTION

The present disclosure is generally directed to nondestructive testing, and more particularly directed to the magnetic particle inspection.

BACKGROUND OF THE INVENTION

Magnetic particle inspection (MPI) processes are non-destructive methods for the detection of surface and sub-surface indications in ferromagnetic materials. These MPI processes make use of an externally applied magnetic field or electric current to produce a magnetic field through the material, and the principle that the magnetic flux from the field or current will leave the test article at the area of the indication. The presence of a surface or near surface indication in the material causes distortion in the magnetic flux through the indication, which in turn causes surface detectable leakage of the magnetic fields at the indication.

Magnetic particles are applied to the magnetized article and are attracted by the surface field in the area of the indication. The accumulation of these magnetic particles indicates the indication. Because indications can present a variable aspect relative to the direction of the applied field, typically two orthogonal orientations of the applied magnetic field, chordal and radial, are needed to inspect an elongated article such as a compressor blade. To produce a magnetic field orientation directed along the blade chordal direction, a current is applied in the platform to tip direction. To produce the magnetic field orientation in the radial direction, a surround coil of a MPI machine can be used.

The radially directed current to produce the chordal field can produce several problems or disadvantages. One disadvantage is that the current can produce blade damage at the contact regions. Arcing damage from the current can be severe at the blade tip where the contact region is small and the surface curved. For blades with a 'pip tip' or other protruding structure, arcing can be severe enough to produce a fire hazard when using hydrocarbon liquids to distribute the magnetic particle needed for the test. Another disadvantage is that the blade can become hot and damaged if the current is very high and multiple MPI current pulses are used.

The object of this disclosure is to provide an improved MPI inspection process that overcomes these and other disadvantages of known MPI processes.

BRIEF DESCRIPTION OF THE INVENTION

In an exemplary embodiment, an MPI apparatus is disclosed that includes a chordal field coil pair, a radial field coil pair, and a power source configured to provide electrical current to the chordal and radial field coil pairs. The chordal field coil pair includes a first and second chordal field coils configured to produce a chordally oriented magnetic flux about the article. The radial field coil pair includes a first and a second radial field coils configured to produce a radially oriented magnetic field about the article.

In another exemplary embodiment, a method of performing a magnetic particle inspection is disclosed that includes positioning an article between a chordal field coil pair, generating a chordal magnetic field between the first and second chordal field coils, applying a magnetic powder to the article, and inspecting the article for indications. The chordal magnetic field is orthogonal to the article. The chordal field coil pair includes a first and a second chordal field coils.

Other features and advantages of the present disclosure will be apparent from the following more detailed description of the preferred embodiment, taken in conjunction with the accompanying drawings which illustrate, by way of example, the principles of the disclosure.

BRIEF DESCRIPTION OF THE DRAWINGS

Wherever possible, the same reference numbers will be used throughout the drawings to represent the same parts.

DETAILED DESCRIPTION OF THE INVENTION

Embodiments of the present disclosure provide a method of performing a MPI inspection using an apparatus including a first set of coils for applying a chordal magnetic field and a second set of coils for applying a radial magnetic field to a article.

One advantage of the present disclosure is providing an MPI apparatus and method that provides high magnetic surface fields at the leading and trailing edges of a article, such as a turbine blade.

Another advantage of the present disclosure is providing an MPI apparatus and method that inspects a ferromagnetic article without direct electrical contact for application of the current.

Another advantage of the present disclosure is providing an MPI apparatus and method having a coil arrangement that increases flux density along edges of an elongated article, such as article having a blade geometry, and more particularly for a turbine blade, thus improving the detectability of imperfections along the blade edge.

Another advantage of the present disclosure is providing an MPI apparatus and method that provides a magnetic field orthogonal to the platform to tip direction of a turbine blade for the detection of indications along the platform to tip direction.

Another disadvantage with known MPI process is that the circular magnetic field is often weak near the leading and trailing edges of the blade, making the detection of indications proximate to the blade edges difficult to detect. Furthermore, article handling during the MPI test can smudge the particles on the blade surface and lead to missing an indication.

This disclosure provides for a method and apparatus for producing orthogonal magnetic fields for MPI inspection of a ferromagnetic article without direct electrical contact. The method and apparatus provide for the required fields and field orientations to detect indications in a test article. The method and apparatus further provides for the reduction or elimination of operator article handling during the inspection process, and viewing of the complete article surface during inspection. Viewing of the article surface using visual data acquisition improves the test by providing the capability of review test data. The data from the test may be stored to provide a test record.

As used herein, the term "indication" includes, but is not limited to, cracks, inclusions, imperfections, flaws and other changes in material characteristics that affect magnetic field flux. In one embodiment, the indication is present near or at the surface of the article. In another embodiment, the indication may be underneath a surface coating.

Figure 1:
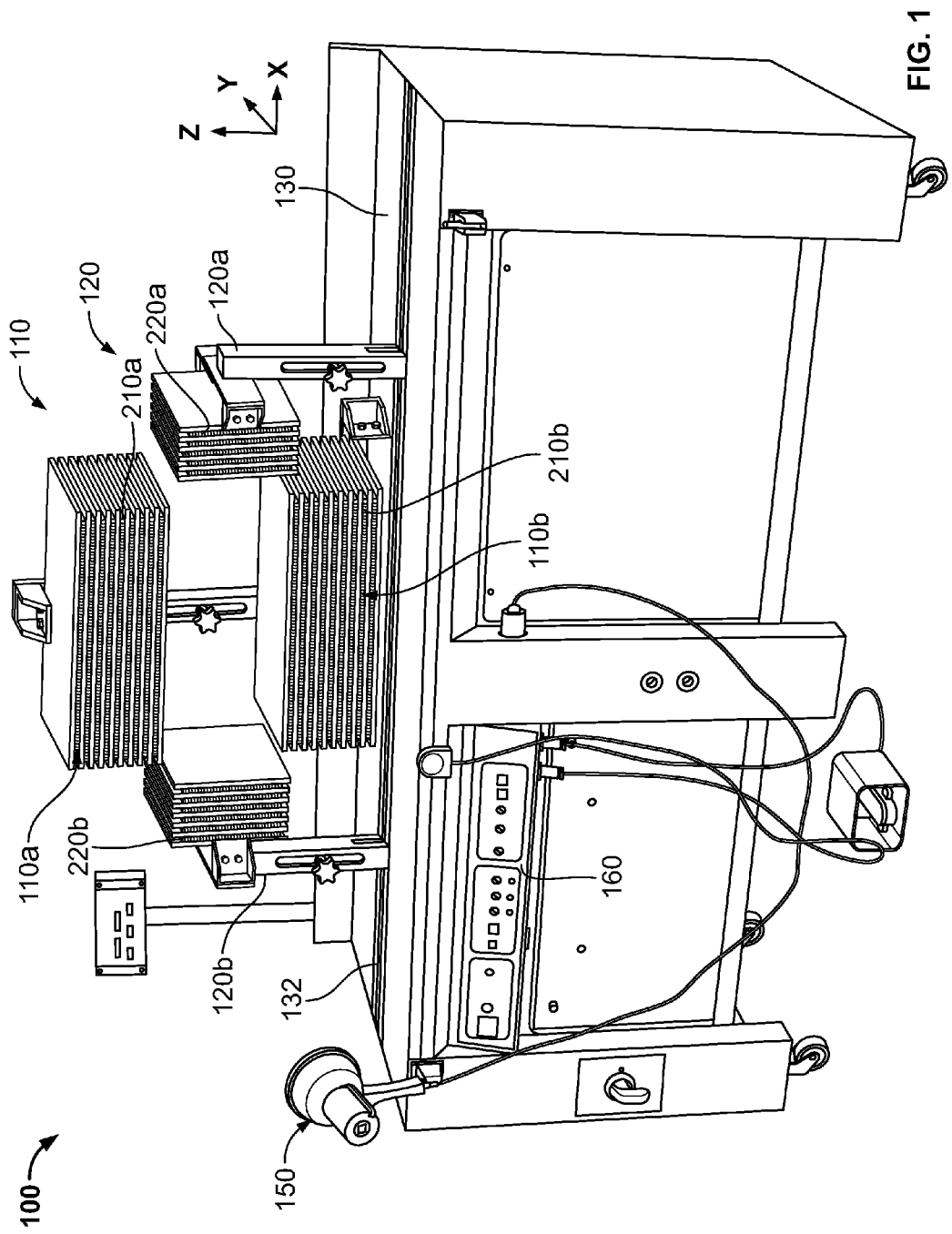
FIG. 1 is a perspective view of an exemplary embodiment of a MPI apparatus according to the disclosure.

FIG. 1 shows an exemplary MPI apparatus 100 according to the disclosure. As can be seen in FIG. 1, the MPI apparatus 100 includes a chordal field system 110 and a radial field system 120. The chordal field system 110 includes a first chordal field system component 110a and a second chordal field system component 110b. The first and second chordal field system components 110a, 110b include first and second chordal field coils 210a, 210b, respectively. The first and second chordal field coils 110a, 110b may be referred to as a chordal field coil pair.

The radial field system 120 includes a first radial field system component 120a and a second radial field system component 120b. The first and second radial field system components 120a, 120b include first and second radial field coils 220a, 220b, respectively. The first and second radial field coils 220a, 220b may be referred to as a radial field coil pair. The first and second chordal field coils 210a, 210b and the first and second radial field coils 220a, 220b may be formed of copper wire wound on ferromagnetic cores or other coil configurations for producing a magnetic field.

The chordal and radial field systems 110, 120 are adjustably mounted on a support surface 130. The support surface 130 allows the chordal and radial field systems 110, 120 to be move into and out of position as needed during the MPI test. In this exemplary embodiment, the support surface 130 includes channels 132 for adjusting the position of the chordal and radial field systems 110, 120 in the X and Y direction. In another embodiment, the support surface 130 may include clamps, pins, slots, rails or other attachment devices for repositioning the chordal and/or radial field systems 110, 120 in the X and Y direction. The chordal and radial field systems 110, 120 and/or the support surface 130 may include adjustment features (not shown) for adjusting the position of the chordal and/or radial field systems 110, 120 in the X, Y and Z direction. Thus, the separation distance between the first and second chordal field system components 110a, 110b and the first and second radial field system components 120a, 120b can be adjusted. The adjustment features may be manually adjustable or may be automated for adjustment by electrical, hydraulic, and/or pneumatic devices. The automated adjustment may be computer or microprocessor controlled.

The MPI apparatus 100 further includes a control panel 160 and power source (not shown) configured to provide power to the chordal and radial field systems 110, 120. The power source may be any conventional power source for energizing field coils to produce a magnetic field within the art. The power source may provide direct current (DC) or alternating current (AC) to the chordal and radial field systems 110, 120.

In one embodiment, the power source energizes the chordal field system 110 or the radial field system 120 to produce a magnetic surface field with a strength of between about 10 gauss and about 90 gauss. In another embodiment, the power source energizes the chordal field system 110 or the radial field system 120 to produce a magnetic surface field with a strength of between about 30 gauss and about 60 gauss. In another embodiment, the power source energizes the chordal field system 110 or the radial field system 120 to produce a magnetic surface field with a strength of about 30 gauss. The MPI apparatus 100 is further shown with an optional ultraviolet (UV) light source 150.

The MPI apparatus 100 further may include an optional digital imaging system (not shown) for recording the results of the MPI examination. The digital imaging system may include a digital camera or other recording device.

Figure 2:
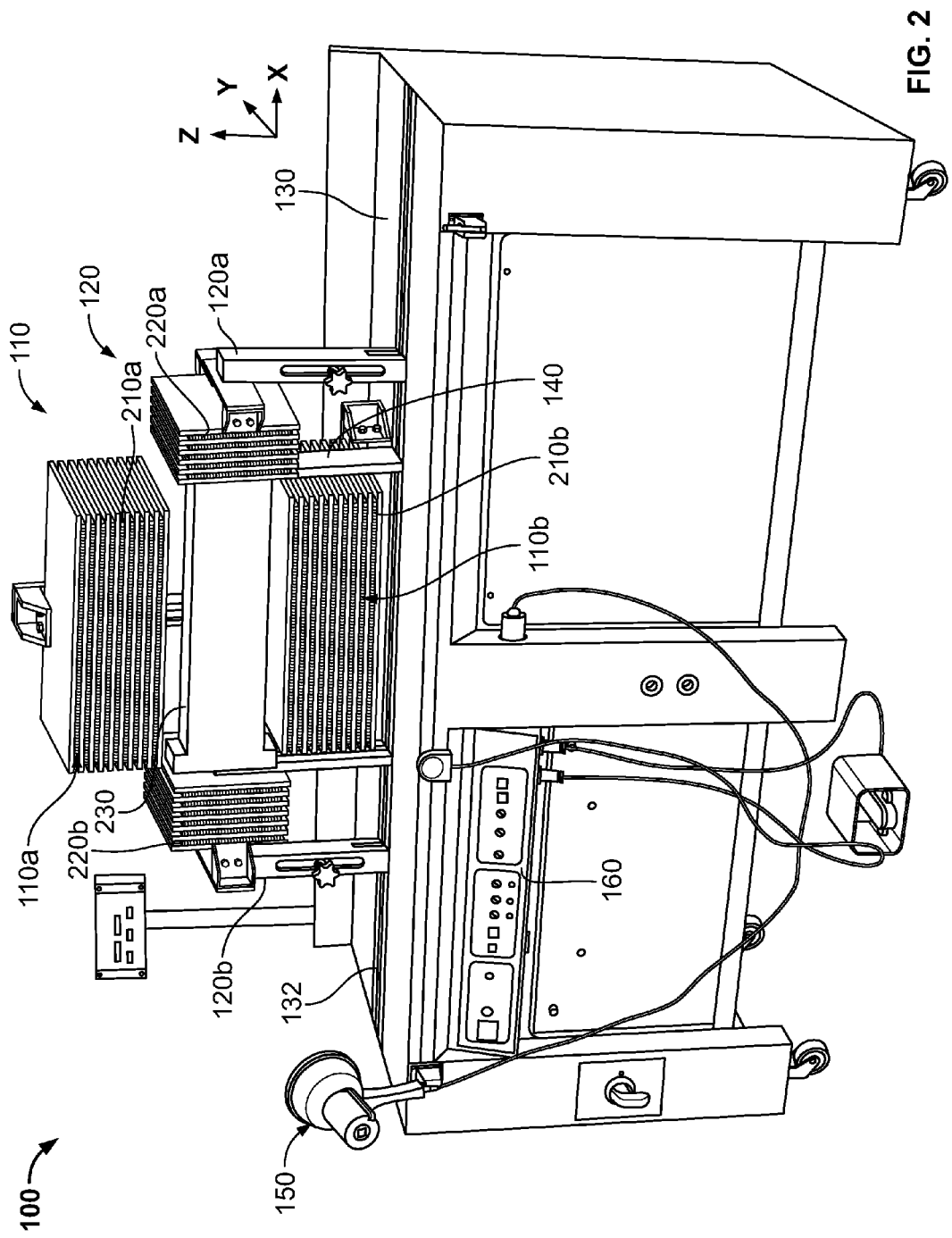
FIG. 2 shows the apparatus of FIG. 1 with an exemplary article positioned for inspection.

FIG. 2 shows a MPI apparatus of FIG. 1 with a article 230 positioned for testing. The chordal and radial field systems 110, 120 are configured to produce two orthogonal orientations of an applied magnetic field to a article 230. When the article 230 has a blade geometry, such as a compressor blade, the present disclosure provides for a coil arrangement that increases flux density along the blade edges, thus improving the detectability of imperfections along the blade edge.

As can be seen in FIG. 2, the MPI apparatus 100 further includes a support device 140 for positioning article 230 within the MPI apparatus 100. In one embodiment, the support device 140 positions the article 230 in a fixed position. In another embodiment, the support device 140 positions the article 230 and allows the position of the article 230 to be adjusted in any one of X, Y and Z directions. In another embodiment, the support device 140 can rotate or pivot the article 230 about the X direction. In one embodiment, the support device 140 can be tipped toward an operator for better viewing. The support device 140 is made of an insulating material that is compatible with the materials used with the MPI examination. In this exemplary embodiment, the support device 140 is shown attached at two positions upon the article 230, however, in other embodiments, the support device 140 may be attached at one or more attachment points.

Figure 3:
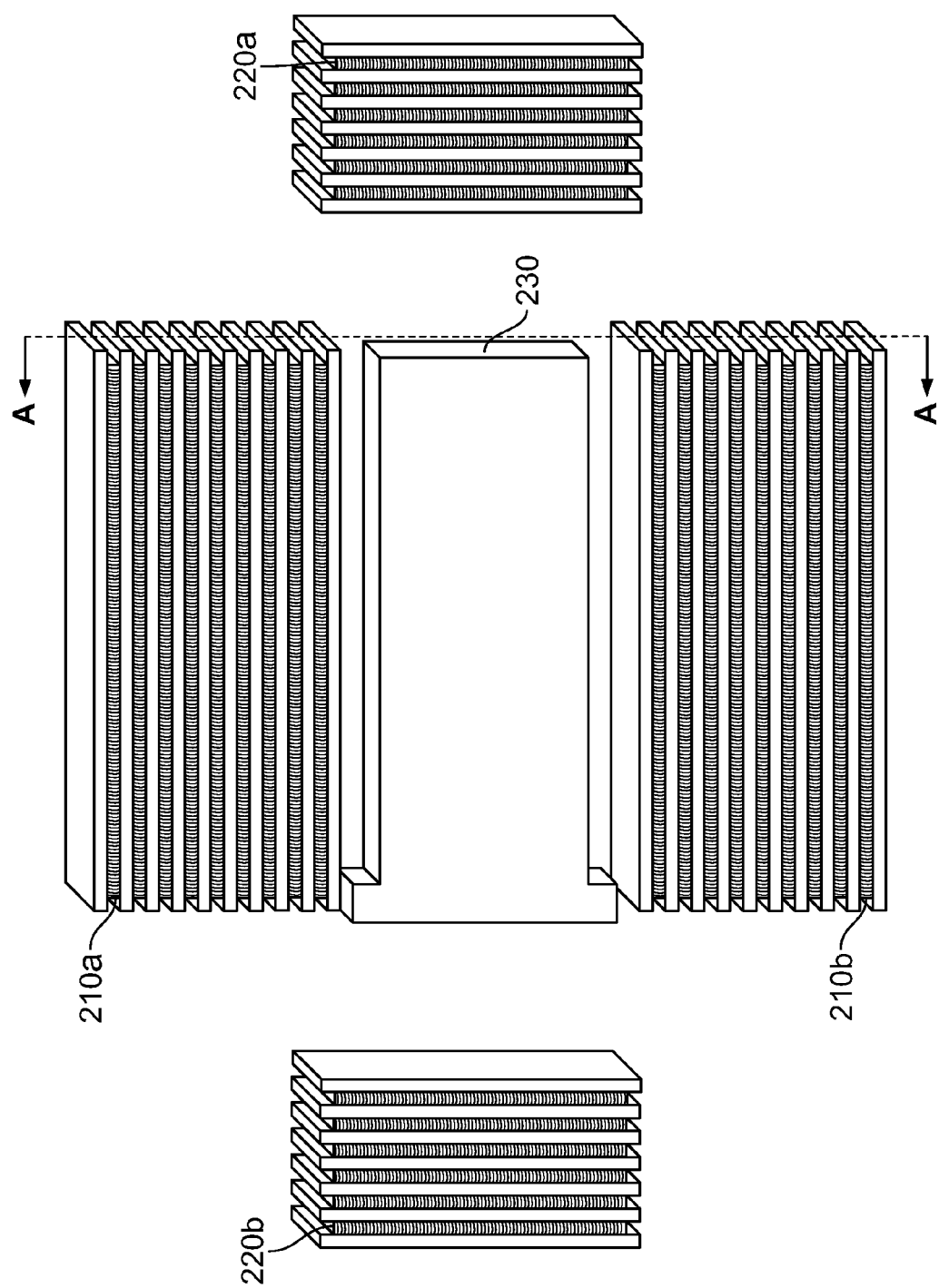
FIG. 3 is a schematic of an exemplary coil configuration according to an embodiment of the disclosure.

FIG. 3 is a schematic diagram of the chordal and radial field coils 210, 220 configured about article 230 as shown in FIG. 2 in a chordal field configuration. As can be seen in FIG. 3, the first and second chordal field coils 210a, 210b are positioned close or proximate to the article 230 to improve coupling of the magnetic field. The first and second radial field coils 220a, 220b are positioned away from the article 230 so that the magnetic cores of the first and second radial field coils 220a, 220b do not affect the field produced by the first and second chordal field coils 210a, 210b. In one embodiment, the first and second radial field coils 220a, 220b are positioned greater than about 1 inch away from the article 230. In another embodiment, the first and second radial field coils 220a, 220b are positioned greater than 2 inches away from the article 230.

Figure 4:
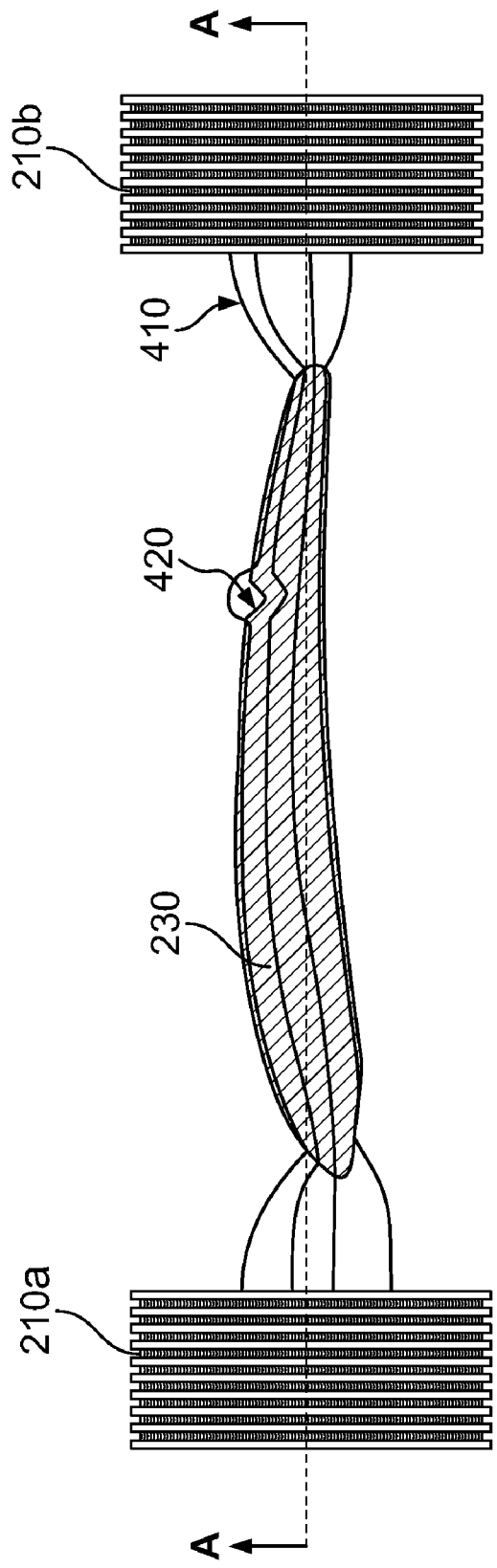
FIG. 4 is a schematic of the chordal field lines generated for the coil configuration of FIG. 3 taken along line A-A in the presence of an indication.

FIG. 4 shows the chordally oriented magnetic flux or field lines 410 produced by the chordal field coils 210a, 210b. As can be seen in FIG. 4, the field lines 410 are disturbed by an indication 420. In particular, some of the field lines leak outside of the article 230. The indication 420 has been exaggerated for explanation purposes.

Figure 5:
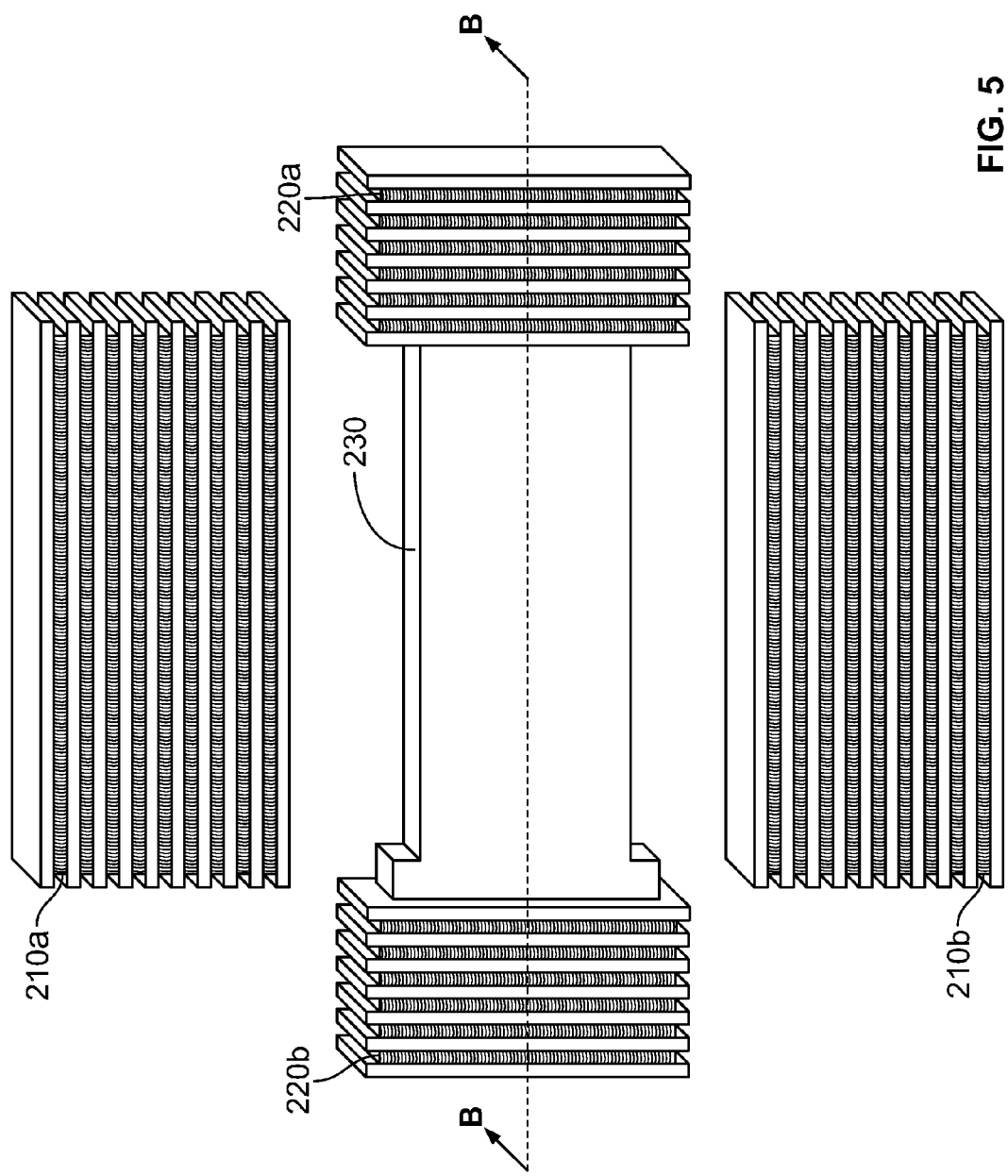
FIG. 5 is a schematic of another exemplary coil configuration according to another embodiment of the disclosure.

FIG. 5 is a schematic diagram of an exemplary configuration of chordal and radial field coils 210, 220 disposed around a article 230 according to another embodiment of the present disclosure. In this configuration, the first and second radial field coils 220a, 220b produce a radially directed magnetic field. In this embodiment, the first and second radial field coils 220a, 220b are positioned proximate to or in contact with article 230 and the first and second chordal field coils 210a, 210b are positioned away from the article 230, so that the magnetic cores of the first and second chordal field coils 210a, 210b do not affect the field produced by the first and second radial field coils 220a, 220b. In one embodiment, the first and second chordal field coils 210a, 210b are positioned greater than about 1 inch from the article 230. In another embodiment, the first and second chordal field coils 210a, 210b are positioned greater than about 2 inches away from the article 230.

Figure 6:
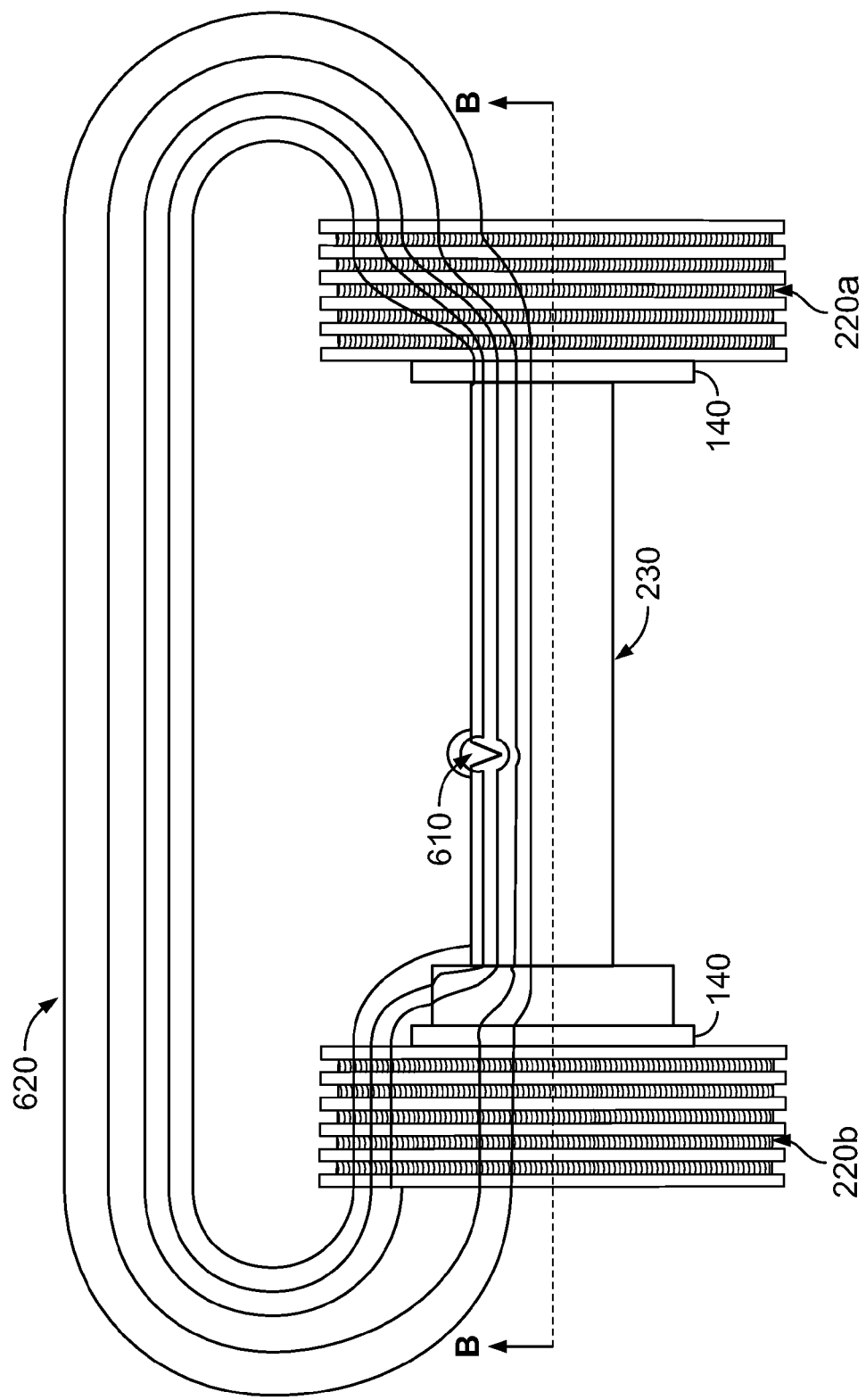
FIG. 6 is a schematic of the radial field lines generated for the coil configuration of FIG. 5 taken along line B-B in the presence of an indication.

FIG. 6 shows the radially oriented magnetic flux or field lines 620 produced by the radial field coils 220a, 220b As can be seen in FIG. 6, the field lines 620 are disturbed by an indication 610. In particular, some of the field lines leak outside of the article 230. The field lines 620 are shown on the side of the article 230 having the indication 610, but have not been shown on the opposing side for clarity. The indication 610 has been exaggerated for explanation purposes.

When the article 230 has been magnetized by application of a field from either or both the chordal and radial field systems 110, 120, magnetic particles are applied to the article 230. The magnetic particles are attracted to locations on the surface where the magnetic field leaks from the article 230, indicating the presence of an indication on the article surface or near surface. In other words, the presence of a surface or near surface indications in the article 230 causes distortion in the magnetic flux through it, which in turn causes leakage of the magnetic fields at the indication.

The magnetic particles may be finely divided iron, magnetic iron oxide, magnetite or other magnetic particles. In one embodiment, the magnetic particles are between about 2 and about 14 microns. The magnetic particles may be held in suspension in a suitable liquid. In one embodiment, the liquid may be an organic solvent such as oil or kerosene. In another embodiment, the liquid may be water or other inorganic solvent.

The magnetic particles are applied by spraying, painting, brushing or other application technique over the magnetized article. The magnetic particles are attracted by the surface field in the area of an indication to indicate the indication.

The ferromagnetic particles may be colored and/or coated with fluorescent dyes that are made visible with a UV light source 150 (FIG. 1). The ferromagnetic magnetic particles are attracted by the surface field in the area of an indication and hold on to the edges of the indication to reveal it as a build-up of particles.

In one embodiment, the power supply is a DC power supply that can provide DC current to the chordal and radial field systems 110, 120. In this embodiment, the chordal field coils 210a, 210b are positioned proximate the article 230 and the radial field coils 220a, 220b are positioned away from the article 230 (as shown in FIG. 3). The chordal field coils 210a, 210b are energized to generate a field oriented in the Z direction (FIG. 2). This field is more interrupted or disturbed by indications that are more pronounced in the X and Y directions. The field may also be interrupted by indications more pronounced in the Z direction, if those indications also significantly interrupt the field in the X and Y directions. Where the indication interrupts the field, some of the field leaks out of the article 230 to produce a field disturbance on the surface of the article 230. The radial field coils 220a, 220b have been moved away from the article 230 to reduce interference with the chordal field. Magnetic particles are then applied to the article 230 and the article 230 is inspected. The article 230 is then cleaned, by wiping, spraying, or other similar method, and the chordial and radial field systems 110, 120 are repositioned to the configuration shown in FIG. 5. The radial field coils 220a, 220b are then energized to produce a field oriented in the Y and Z direction (FIG. 2). This field is more interrupted or disturbed by indications that are more pronounced in the Y and Z directions. The field may also be interrupted by indications more pronounced in the X direction, if those indications also significantly interrupt the field in the Y and Z directions. Where the indication interrupts the field, some of the field leaks out of the article 230 to produce a field disturbance on the surface of the article 230. The chordal field coils 210a, 210b have been moved away from the article 230 to reduce interference with the radial field. Magnetic particles are then applied to the article 230 and the article 230 is inspected.

In another embodiment, the power supply is a AC power supply that provides AC current to the chordal and radial field systems 110, 120. The current to the chordal and radial field systems is out of phase so the generated fields do not interfere with one another. In this embodiment, the chordal field coils 210a, 210b and the radial field coils 220a, 220b are both positioned near the article 230. In one embodiment, the chordal field coils 210a, 210b and the radial field coils 220a, 220b generate overlapping fields. In another embodiment, the chordal field coils 210a, 210b and the radial field coils 220a, 220b generate fields at different times. For both embodiments, magnetic particles are applied and the article 230 after the field generation and the article 230 is inspected.

This inspection technique can be applied to ferromagnetic parts. The ferromagnetic parts may be cast or extruded. The ferromagnetic parts may have a machined surface, and may have a planar geometric shape, such as but not limited to a turbine blade, welded pipes, welded bars, welded piston valve stems, and jet engine blisks. For example, the ferromagnetic parts may be power generation turbines, ferromagnetic blades or ferromagnetic blades with magnetic properties. For example, the ferromagnetic parts may be a raw material in a steel mill (billets or slabs), in the early stages of manufacturing (forgings, castings), or to machined parts before they are put into service. It can also used for inspecting structural parts that have been inservice, for example, to find fatigue cracks.

While the disclosure has been described with reference to a preferred embodiment, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

What is claimed is:

1. A magnetic particle inspection apparatus for inspecting a article, comprising:
    a chordal field coil pair comprising a first and a second chordal field coil configured to produce a chordally oriented magnetic flux about the article; and
    a radial field coil pair comprising a first and a second radial field coil configured to produce a radially oriented magnetic field about the article substantially transverse to that produced by the chordal field coil pair;
    a support device comprising an insulating material to support the article without electrical contact by application of current to the article; and
    a power source configured to provide electrical current to the chordal and radial field coil pairs.

2. The apparatus of claim 1, wherein the first and second chordal field coils are further configured to be moved toward and away from the article.

3. The apparatus of claim 1, wherein the first and second radial field coils are further configured to be moved toward and away from the article.

4. The apparatus of claim 3, wherein the first and second chordal field coils are further configured to be moved toward and away from the article.

5. The apparatus of claim 1, wherein the first and second radial field coils produce a surface field of about 10 gauss to about 90 gauss.

6. The apparatus of claim 1, wherein the first and second radial field coils produce a surface field of about 30 gauss to about 60 gauss.

7. The apparatus of claim 1, further comprising a support surface capable of affixing the first and second radial field coils at different separation distances.

8. The apparatus of claim 1, further comprising:
a support device for positioning the article between the first and second radial field coils.

9. The apparatus of claim 1, wherein the distance between the first and second chordal field coils is adjustable.

10. The apparatus of claim 8, wherein the support device is configured to adjust the orientation of the article between the first and second chordal field coils.

11. A method of performing a magnetic particle inspection, comprising:
positioning a article between a chordal field coil pair comprising a first and a second chordal field coils;
generating a chordal magnetic field between the first and second chordal field coils by application of electrical current to the chordal field pair without application of direct electrical current to the article;
applying a magnetic powder to the article;
inspecting the article for indications;
wherein the chordal magnetic field is orthogonal to the article;
positioning the article between a radial field coil pair comprising a first and second radial field coils; and
generating a radial magnetic field between the first and second radial field coils by application of electrical current to the radial field pair without application of direct electrical current to the article;
wherein the radial field is orthogonal to the article and to the chordal magnetic field.

12. The method of claim 11, wherein the chordal magnetic field is generated by providing a DC current to the chordal field coil pair.

13. The method of claim 11, wherein the chordal magnetic field is generated by providing a AC current to the chordal field coil pair.

14. The method of claim 11, wherein the first and second chordal field coils are configured to be moved toward and away from the article, thereby modifying magnetic coupling of the magnetic field with distance from the article.

15. The method of claim 11, wherein the first and second radial field coils produce a surface field of about 10 gauss to about 90 gauss.

16. The method of claim 11, wherein the first and second radial field coils produce a surface field of about 30 gauss to about 60 gauss.

17. The method of claim 11, wherein the first and second radial field coils are configured to be moved toward and away from the article.

18. The method of claim 11, wherein the radial magnetic field is generated by providing a DC current to the radial field coil pair.

19. The method of claim 11, wherein the radial magnetic field is generated by providing a AC current to the radial field coil pair.

* * * * *